(12) United States Patent
Yoshida

(10) Patent No.: US 6,831,488 B1
(45) Date of Patent: Dec. 14, 2004

(54) SEMICONDUCTOR INTEGRATED CIRCUIT DEVICE HAVING AN ACTIVE PULL-UP/PULL-DOWN CIRCUIT

(75) Inventor: Hiroshi Yoshida, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/654,946

(22) Filed: Sep. 5, 2003

(51) Int. Cl.[7] .............................................. H03B 1/00
(52) U.S. Cl. ........................................ 327/112; 326/83
(58) Field of Search ................................ 327/108–109, 327/112, 185, 374–377, 379, 383, 389, 391; 326/56–58, 82–83, 89, 95, 98, 85

(56) References Cited

U.S. PATENT DOCUMENTS

| | | | | |
|---|---|---|---|---|
| 5,225,723 | A | * | 7/1993 | Drako et al. ................. 326/98 |
| 5,489,858 | A | * | 2/1996 | Pierce et al. ................. 326/56 |
| 6,034,545 | A | * | 3/2000 | Flynn ........................... 326/39 |
| 6,388,467 | B1 | * | 5/2002 | Ward et al. ................... 326/56 |
| 6,590,418 | B1 | * | 7/2003 | Sams ........................... 326/39 |

FOREIGN PATENT DOCUMENTS

| | | |
|---|---|---|
| JP | 62-176326 | 8/1987 |
| JP | 1-123453 | 5/1989 |
| JP | 4-138717 | 5/1992 |
| JP | 5-48023 | 2/1993 |

* cited by examiner

Primary Examiner—My-Trang Nu Ton
(74) Attorney, Agent, or Firm—Oblon, Spivak, McClelland, Maier & Neustadt, P.C.

(57) ABSTRACT

One end of a control signal line having a buffer is connected to a control terminal. The other end of the control signal line is connected to a third terminal of an input/output logic changing circuit, a gate of a PMOSFET, and a gate of an NMOSFET. An input terminal is connected to a first terminal of the logic changing circuit. A second terminal of the logic changing circuit is connected to an output terminal. These elements are provided on a semiconductor chip. When the input terminal is in an open state, the PMOSFET and the NMOSFET functioning as pull-up and pull-down MOS transistors, respectively, are controlled by a control signal on the control signal line. When an input signal is applied to the input terminal, the logic changing circuit determines a logic level of an output signal based on the input signal and the control signal to thereby output the output signal to the output terminal.

20 Claims, 11 Drawing Sheets

F I G. 2
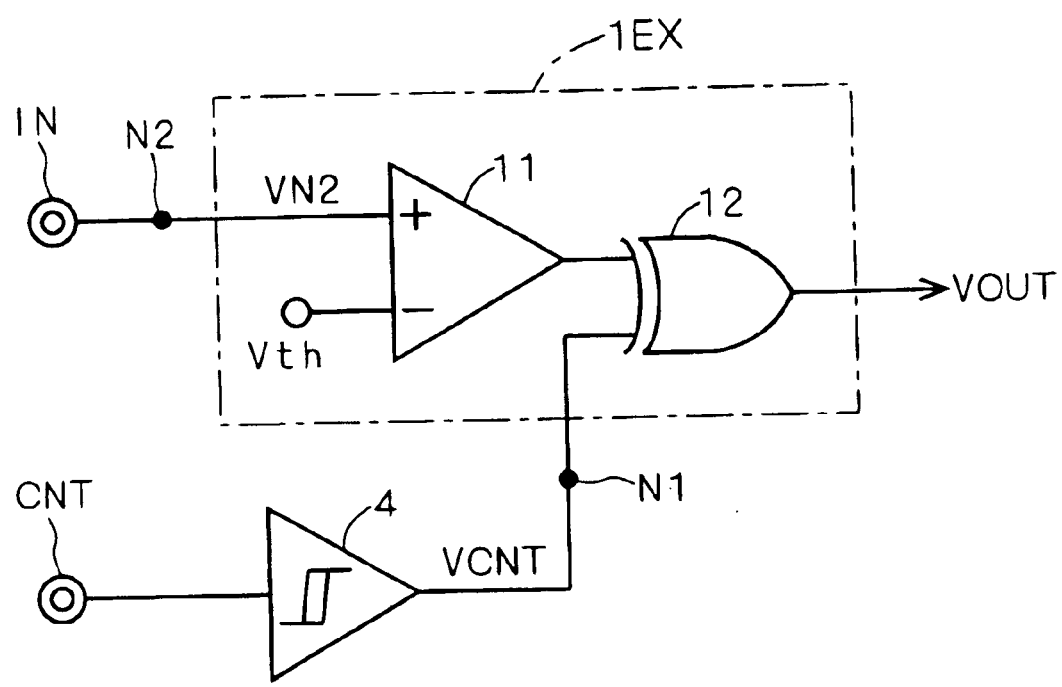

FIG. 4
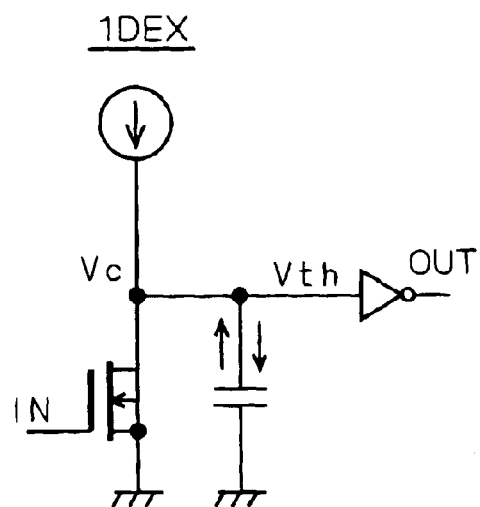
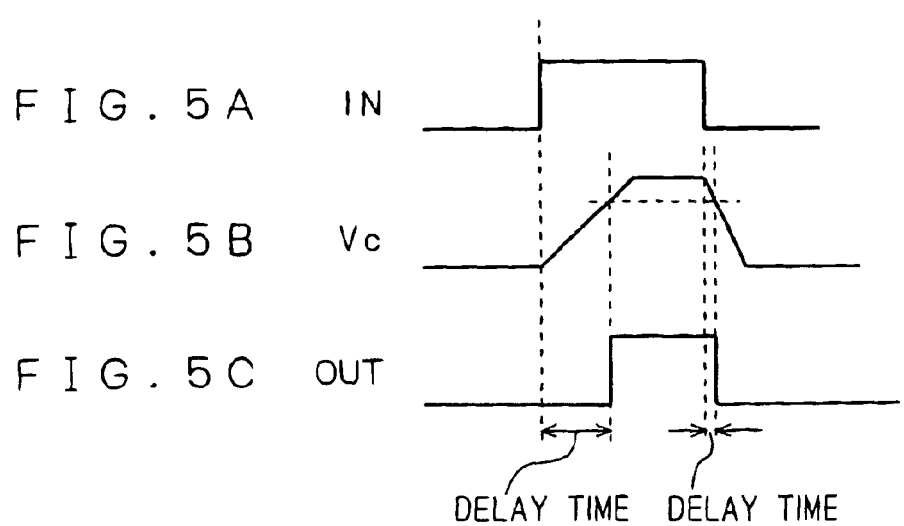
FIG. 5A  IN
FIG. 5B  Vc
FIG. 5C  OUT
DELAY TIME   DELAY TIME $Vc=1/(1+j\omega CR)VCNT$ ($\omega$ : NOISE FREQUENCY)
$\Delta Vc$ GETS CLOSER TO 0V ($\Delta Vc \fallingdotseq 0V$) WITH INCREASE OF C, TO REDUCE INFLUENCE OF NOISE

SEMICONDUCTOR INTEGRATED CIRCUIT DEVICE HAVING AN ACTIVE PULL-UP/PULL-DOWN CIRCUIT

BACKGROUND OF THE INVENTION

1. Field of the Invention

The present invention relates to control over pull-up/pull-down on an input terminal of a semiconductor integrated circuit.

2. Description of the Background Art

In an open state of a semiconductor integrated circuit in which nothing is connected to an input terminal of the semiconductor integrated circuit, more specifically, a state in which a specific voltage or current is not applied to the input terminal of the semiconductor integrated circuit, an input voltage is indeterminate, to cause malfunction in outputting. A typical solution for avoiding such situation is to provide a control circuit for performing pull-up or pull-down on the input terminal of the semiconductor integrated circuit.

Which of pull-up or pull-down is performed depends chiefly on logical relationship between an input signal to be pulled up or down and an output signal associated with the input signal. Either pull-up or pull-down is selected to be performed in accordance with logical relationship between an input signal and an output signal associated with the input signal.

In the conventional art, as respective logics of an input signal and an output signal are uniquely determined, which of pull-up or pull-down should be performed on an input terminal is uniquely determined.

For this reason, when it becomes necessary to change logical relationship between an input signal and an output signal, or to switch between pull-up and pull-down in a semiconductor integrated circuit, an additional design for achieving new logical relationship between input and output signals, or for achieving either pull-up or pull-down, is required. This increases manufacturing cost as well as labor for managing products, disadvantageously.

SUMMARY OF THE INVENTION

It is an object of the present invention to obtain internal or external control over selection between a pull-up resistor and a pull-down resistor when no input signal is supplied, and change of logics of input and output signals in a semiconductor integrated circuit device.

According to the present invention, a semiconductor integrated circuit device includes a power supply line, an input terminal, an output terminal, a control terminal, a ground terminal, a first MOS transistor, a second MOS transistor, an input/output logic changing circuit and a control signal line.

The first MOS transistor includes a first main electrode connected to the power supply line, a second main electrode connected to the input terminal, and a first gate electrode. The first MOS transistor flows a pull-up current from the first main electrode to the second main electrode in a first on-state where the first MOS transistor is in an on-state when no input signal is input to the input terminal.

The second MOS transistor includes a third main electrode connected to the input terminal, a fourth main electrode connected to the ground terminal, and a second gate electrode. The second MOS transistor flows a pull-down current from the third main electrode to the fourth main electrode in a second on-state where the second MOS transistor is in an on-state when no input signal is input to the input terminal.

The input/output logic changing circuit includes a first terminal connected to the input terminal, a second terminal connected to the output terminal, and a third terminal.

The control signal line includes one end connected to the control terminal and the other end connected to the first gate electrode, the second gate electrode and the third terminal. The control signal line transmits a control signal thereon to the other end.

When the control signal has a first level, the first MOS transistor and the second MOS transistor are placed in the first on-state and a second off-state where the second MOS transistor is in an off-state, respectively. When the control signal has a second level, the first MOS transistor and the second MOS transistor are placed in a first off-state where the first MOS transistor is in an off-state and the second on-state, respectively.

When an input signal is input to the input terminal, the input/output logic changing circuit determines a logic level of an output signal based on the input signal and the control signal to thereby output the output signal to the output terminal.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram illustrating an example of a configuration of an input/output logic changing circuit according to the first preferred embodiment.

FIG. 4 illustrates an example of a configuration of a delay circuit according to the first modification.

FIGS. 5A, 5B and 5C are timing charts for illustrating operations of the delay circuit according to the first modification.

DESCRIPTION OF THE PREFERRED EMBODIMENTS

First Preferred Embodiment

Figure 1:
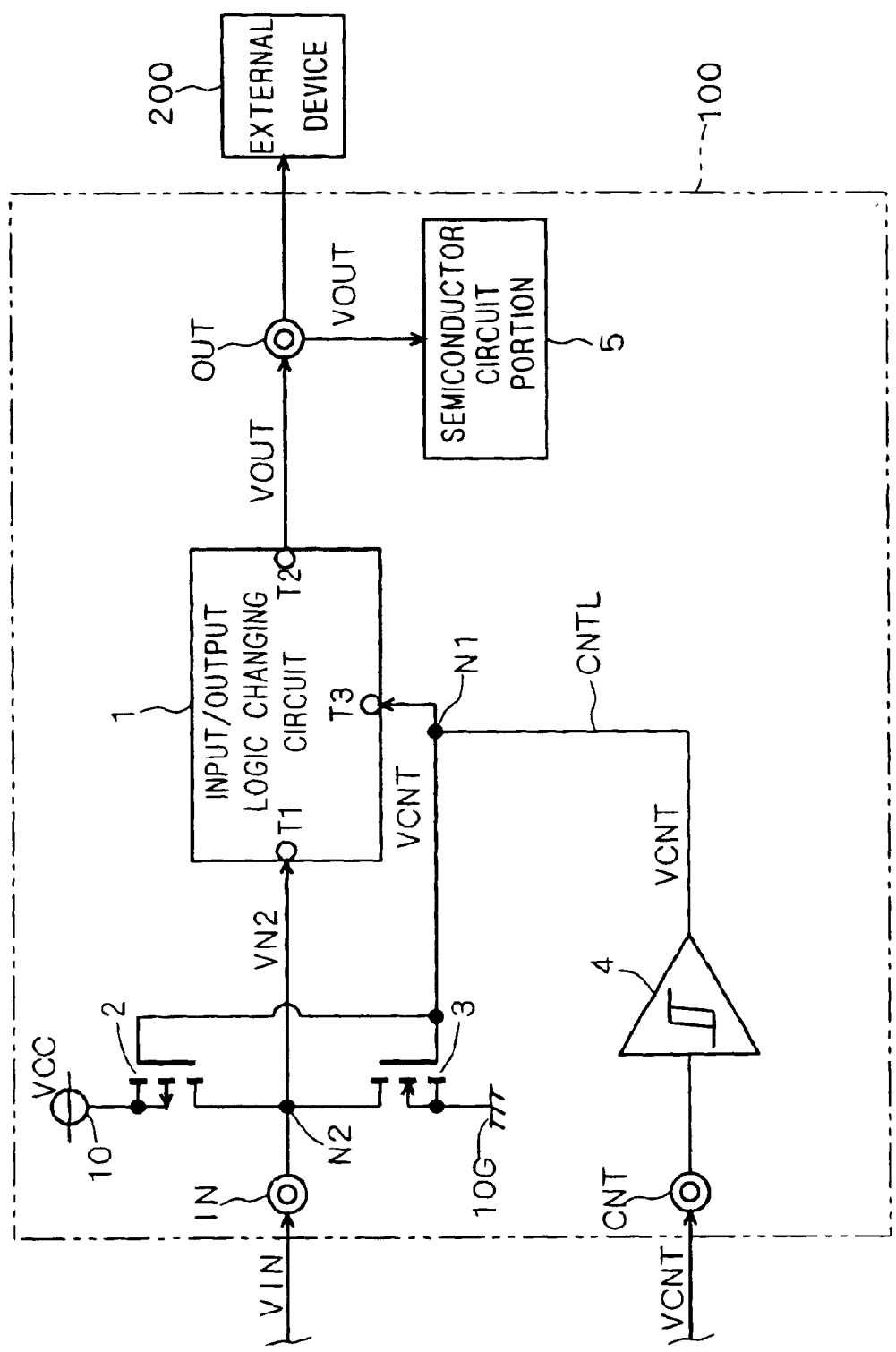
FIG. 1 is a block diagram illustrating a configuration of a semiconductor integrated circuit device according to a first preferred embodiment of the present invention.

FIG. 1 is a block diagram illustrating a configuration of a semiconductor integrated circuit device according to a first preferred embodiment of the present invention, together with an external device 200. The semiconductor integrated circuit device according to the first preferred embodiment includes various elements formed on a semiconductor chip 100 which employs a silicon substrate as a base material, for example. Out of the various elements, circuit elements that contribute to the subject matter of the present invention will be described in detail below.

The semiconductor chip (or semiconductor integrated circuit device) 100 includes, roughly: (1) a power supply 10 providing a power supply potential VCC (a power supply line from the power supply 10 transmitting the power supply potential or a power supply voltage VCC); (2) an input terminal IN; (3) an output terminal OUT; (4) a control terminal, or a terminal receiving an externally supplied signal, CNT; (5) a ground terminal 10G held at a ground potential; (6) a first MOS transistor 2 used for pull-up (the first MOS transistor 2 functions as a pull-up resistor by virtue of an on-resistance thereof. It is assumed that a P-type MOSFET is employed as the first MOS transistor 2 in an example discussed in the first preferred embodiment); (7) a second MOS transistor 3 used for pull-down (the second MOS transistor 3 functions as a pull-down resistor by virtue of an on-resistance thereof. It is assumed that an N-type MOSFET is employed as the second MOS transistor 3 in the example discussed in the first preferred embodiment); (8) an input/output logic changing circuit 1; (9) a control signal line CNTL including a buffer 4 (an arbitrary element); and (10) a semiconductor circuit portion (internal circuit) 5 which is formed within the device 100 and receives an output signal VOUT applied to the output terminal OUT, as an input signal thereto (an inverter circuit including an IGBT device, for example). It is noted that the output signal VOUT applied to the output terminal OUT can also be used as an input signal to the external device 200 (a sensor device, for example).

With the foregoing circuit elements, when the input terminal IN is placed in an open state, in other words, when an input signal VIN externally generated is not applied to the input terminal IN, the first MOS transistor 2 functions as a pull-up transistor or a pull-up resistor which flows a pull-up current for charging a floating capacitor (not illustrated) in the input terminal IN placed in an open state, to the potential VCC, under control of a control signal VCNT transmitted through the control signal line CN. To this end, the first MOS transistor 2 includes a first main electrode (corresponding to a source electrode in this example) connected to the power supply 10, a second main electrode (corresponding to a drain electrode in this case) connected to the input terminal IN or a second node N2, and a first gate electrode. The first MOS transistor 2 flows a pull-up current from the first main electrode to the second main electrode in an on-state thereof (corresponding to a first on-state) when no input signal VIN is input to the input terminal IN.

On the other hand, when the input terminal IN is placed in an open state, the second MOS transistor 3 functions as a pull-down transistor or a pull-down resistor which flows a pull-down current for sending all charges carried by the floating capacitor (not illustrated) which has already been charged up, toward the ground terminal 10G, under control of the control signal VCNT on the control signal line CNTL. To this end, the second MOS transistor 3 includes a third main electrode (corresponding to a drain electrode in this example) connected to the input terminal IN or the second node N2, a fourth main electrode (corresponding to a drain electrode in this example) connected to the ground terminal 10G, and a second gate electrode. The second MOS transistor 3 flows a pull-down current from the third main electrode to the fourth main electrode in an on-state thereof (corresponding to a second on-state) when no input signal VIN is input to the input terminal IN.

The input/output logic changing circuit 1, which forms one part of a core of the semiconductor integrated circuit device 100 according to the first preferred embodiment, includes a first terminal T1 connected to the input terminal IN or the second node N2, a second terminal T2 connected to the output terminal OUT, and a third terminal T3.

The control signal line CNTL, which forms the other part of the core of the semiconductor integrated circuit device 100 according to the first preferred embodiment, includes one end connected to the control terminal CNT and the other end or a first node N1 connected to the first gate electrode of the first MOS transistor 2, the second gate electrode of the second MOS transistor 3 and the third terminal T3 in common. The control signal VCNT externally generated is input to the control terminal CNT. Then, the control signal line CNTL transmits the control signal VCNT thereon to the other end or the common (first) node N1 via the buffer 4.

When the control signal VCNT has a first level ("L" level in this example), the first MOS transistor 2 and the second MOS transistor 3 are placed in an on-state and an off-state, respectively. In contrast thereto, when the control signal VCNT has a second level ("H" level in this example), the first MOS transistor 2 and the second MOS transistor 3 are placed in an off-state and an on-state, respectively.

The input/output logic changing circuit 1 determines a logic level of the output signal VOUT based on an input signal (voltage) VN2 and the control signal VCNT and outputs the output signal VOUT to the output terminal OUT. That is, the input/output logic changing circuit 1 is formed of a typical logic circuit and thus operates as follows. When a logic level of the input signal VN2 is "H" level, the input/output logic changing circuit 1 outputs the output signal VOUT having either "H" level or "L" level in accordance with a logic level of the control signal VCNT. Also, when a logic level of the input signal VN2 is "L" level, the input/output logic changing circuit 1 outputs the output signal VOUT having either "H" level or "L" level in accordance with the logic level of the control signal VCNT.

Next, description will be made about operations of the semiconductor integrated circuit device 100 according to the first preferred embodiment, for each of two cases of a case A in which the input terminal IN is placed in an open state, and a case B in which the input terminal IN is placed in a non-open state (in other words, a specific voltage or current serving as the input signal VIN is externally supplied to the input terminal IN).

<Case A>

As illustrated in FIG. 1, the P-type MOS transistor 2 and the N-type MOS transistor 3 are connected such that the transistors 2 and 3 can function as a pull-up resistor and a pull-down resistor for performing pull-up and pull-down on the input terminal IN, respectively. The control terminal CNT or the control signal line CNTL functions to select either pull-up or pull-down to be performed. More specifically, the P-type MOS transistor 2 and the N-type MOS transistor 3 are turned on/off in accordance with the logic level ("L" level/"H" level) of the control signal VCNT applied to the control terminal CNT, to switch from pull-down to pull-up, or vice versa. For example, when the logic level of the control signal VCNT on the control signal line CNTL is changed from "H" level to "L" level, the P-type MOS transistor 2 functions as a pull-up resistor. In this situation, even if the input terminal IN is placed in an open state, the logic level of the input voltage VN2 on the second node N2 is "H" level. At that time, whether or not logics of an input signal and an output signal in the input/output logic changing circuit 1 should be changed depends on a logical circuit configuration within the input/output logic changing circuit 1. The input/output logic changing circuit 1 maintains the logic level of the input voltage VN2 at "H" level, or reverses it, i.e., changes the logic level of the input voltage VN2 from "H" level to "L" level, in accordance with the control signal VCNT having "L" level. In contrast, when the logic level of the control signal VCNT on the control signal line CNTL is changed from "L" level to "H" level, the N-type MOS transistor 3 functions as a pull-down resistor. In this situation, even if the input terminal IN is placed in an open state, the logic level of the input voltage VN2 on the second node N2 is maintained at "L" level. The input/output logic changing circuit 1 maintains the logic level of the input voltage VN2 at "L" level, or reverses it, i.e., changes the logic level of the input voltage VN2 from "L" level to "H" level, in accordance with the control signal VCNT having "H" level.

<Case B>

In the case B, the input signal VIN having a specific logic level is applied to the input terminal IN, and the logic level of the input voltage VN2 on the second node N2 is equal to that of the input signal VIN (VIN=VN2). In this situation, the input/output logic changing circuit 1 sets the specific logic level of the input signal VIN to either "H" level or "L" level in accordance with the logic level of the control signal VCNT, while depending on a logical circuit configuration within the input/output logic changing circuit 1. Then, the input/output logic changing circuit 1 applies a signal having the previously-set logic level to the output terminal OUT, as the output signal VOUT. The output signal VOUT is then received by the internal circuit 5 or the external device 200, as an input signal thereto. As described, because of inclusion of the input/output logic changing circuit 1, it is possible to flexibly implement the output signal VOUT having a certain logic level which is required to be possessed by an input signal to the internal circuit 5 or the external device 200, through control based on the logic level of the control signal VCNT (, which provides for improvement in flexibility of design).

FIG. 2 illustrates an example of the first preferred embodiment. More particularly, FIG. 2 is a block diagram illustrating a specific example of a configuration of the input/output logic changing circuit 1 in FIG. 1. As illustrated in FIG. 2, an input/output logic changing circuit 1EX as the specific example of the input/output logic changing circuit 1, has a comparator 11 including a positive terminal + connected to the input terminal IN and a negative terminal − to which a threshold voltage Vth is applied. The threshold voltage Vth is higher than a ground potential at which the ground terminal 10G is held and lower than the power supply potential VCC of the power supply 10. The input/output logic changing circuit 1EX further has an exclusive-or (XOR) circuit 12 including a first input terminal connected to an output terminal of the comparator 11 and a second input terminal connected to the other end or the first node N1 of the control signal line CNTL. Namely, the second input terminal of the XOR circuit 12 corresponds to the third terminal T3 of FIG. 1. An output terminal of the XOR circuit 12 corresponds to the second terminal T2 of FIG. 1. For example, assuming that the input signal VIN externally applied to the input terminal IN, i.e., the input voltage VN2 on the second node N2, is higher than the threshold voltage Vth, the comparator 11 generates and outputs a signal having a logic level of "H". As a result of this, the XOR circuit 12 generates and outputs the output signal VOUT having "L" level when the logic level of the control signal VCNT is "H" level, while generating and outputting the output signal VOUT having "H" level when the logic level of the control signal VCNT is "L" level. In contrast, when the input signal VIN is equal to or lower than the threshold voltage Vth, the above-noted logic relationship between the input signal VIN and the output signal VOUT which varies in accordance with the logic level of the control signal VCNT is reversed.

As described above, in accordance with the first preferred embodiment, a semiconductor integrated circuit device comprising a control circuit system which allows selection between a pull-up resistor and a pull-down resistor to be performed by external processes when an input terminal is placed in an open state, as well as allows change of respective logic levels of input and output signals to be controlled by external processes when the input terminal is placed in a non-open state, can be obtained. Hence, in accordance with the first preferred embodiment, a semiconductor integrated circuit device which is adaptable to a wide variety of applications and provides for greater flexibility in design can be obtained.

First Modification

Figure 3:
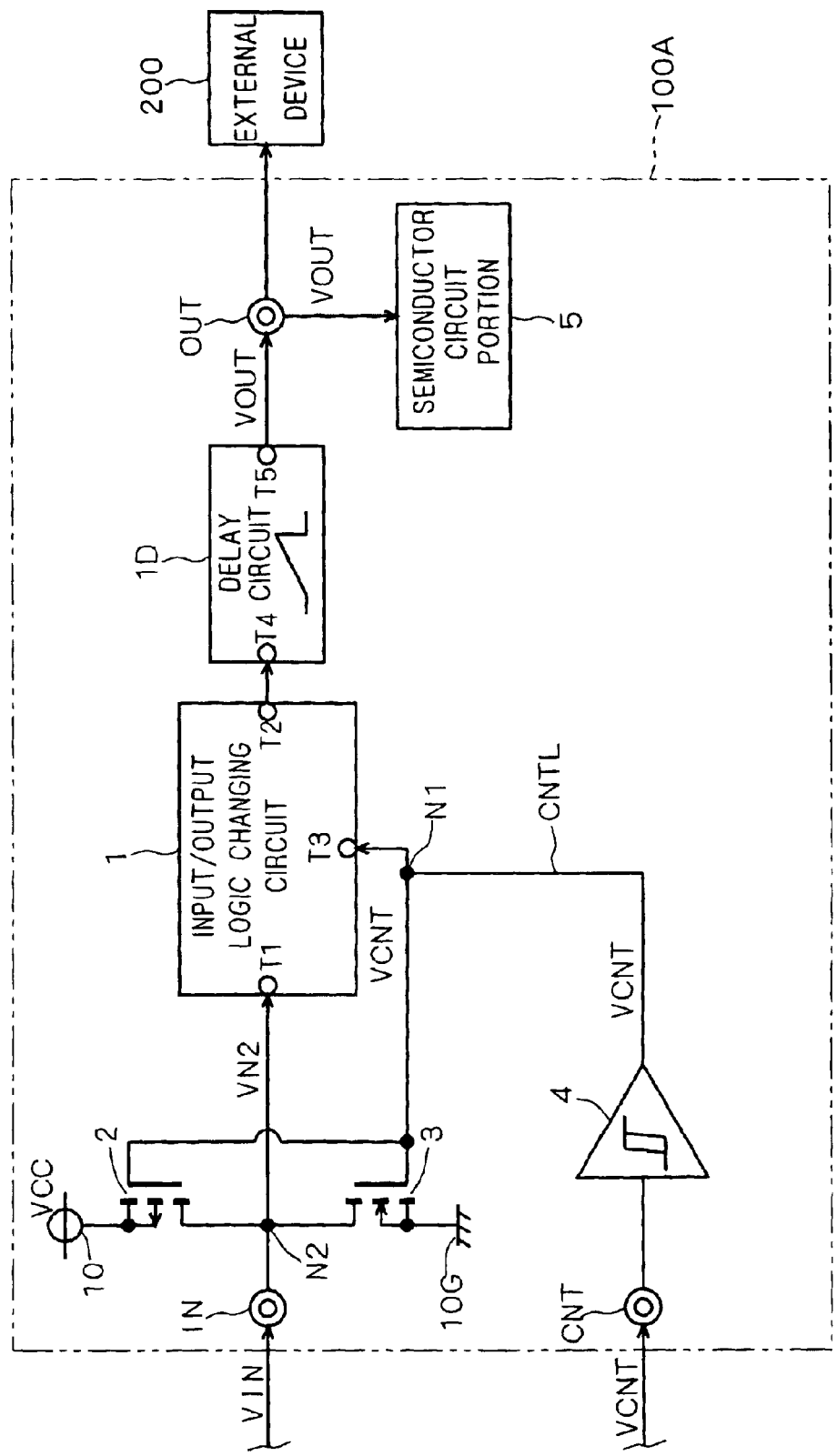
FIG. 3 is a block diagram illustrating a configuration of a semiconductor integrated circuit device according to a first modification of the present invention.

FIG. 3 is a block diagram illustrating a configuration of a semiconductor integrated circuit device 100A according to a first modification of the first preferred embodiment. FIG. 4 illustrates a specific example of a configuration of a delay circuit 1D (in FIG. 3) which forms a core of the first modification. It is noted that the delay circuit 1D is not limited to the example which is illustrated in FIG. 4 as a delay circuit 1DEX, of course. The delay circuit 1D may be formed of a delay line providing a predetermined delay time, for example. Further, FIGS. 5A, 5B and 5C are timing charts for illustrating operations of the delay circuit 1DEX in FIG. 4.

A feature of the first modification resides in that the delay circuit 1D is additionally provided between the second terminal (or output terminal) T2 of the input/output logic changing circuit 1 and the output terminal OUT in the configuration of FIG. 1, as illustrated in FIG. 3. The delay circuit 1D includes a fourth terminal T4 connected to the second terminal T2 and a fifth terminal T5 connected to the output terminal OUT, and provides a predetermined delay time. The delay circuit 1D delays an output signal of the input/output logic changing circuit 1, to output a signal obtained by delaying the output signal of the input/output logic changing circuit 1 (a delayed output signal), as the output signal VOUT, to the output terminal OUT. Hence, the output signal VOUT is also referred to as a "delayed output signal VOUT".

Thus, in accordance with the first modification, it is possible to flexibly achieve a delay of the output signal VOUT relative to the input signal VIN as required by the circuits 5 and 200 in view of specification thereof, each of which circuits uses the output signal VOUT as an input signal thereto.

Second Modification

Figure 6:
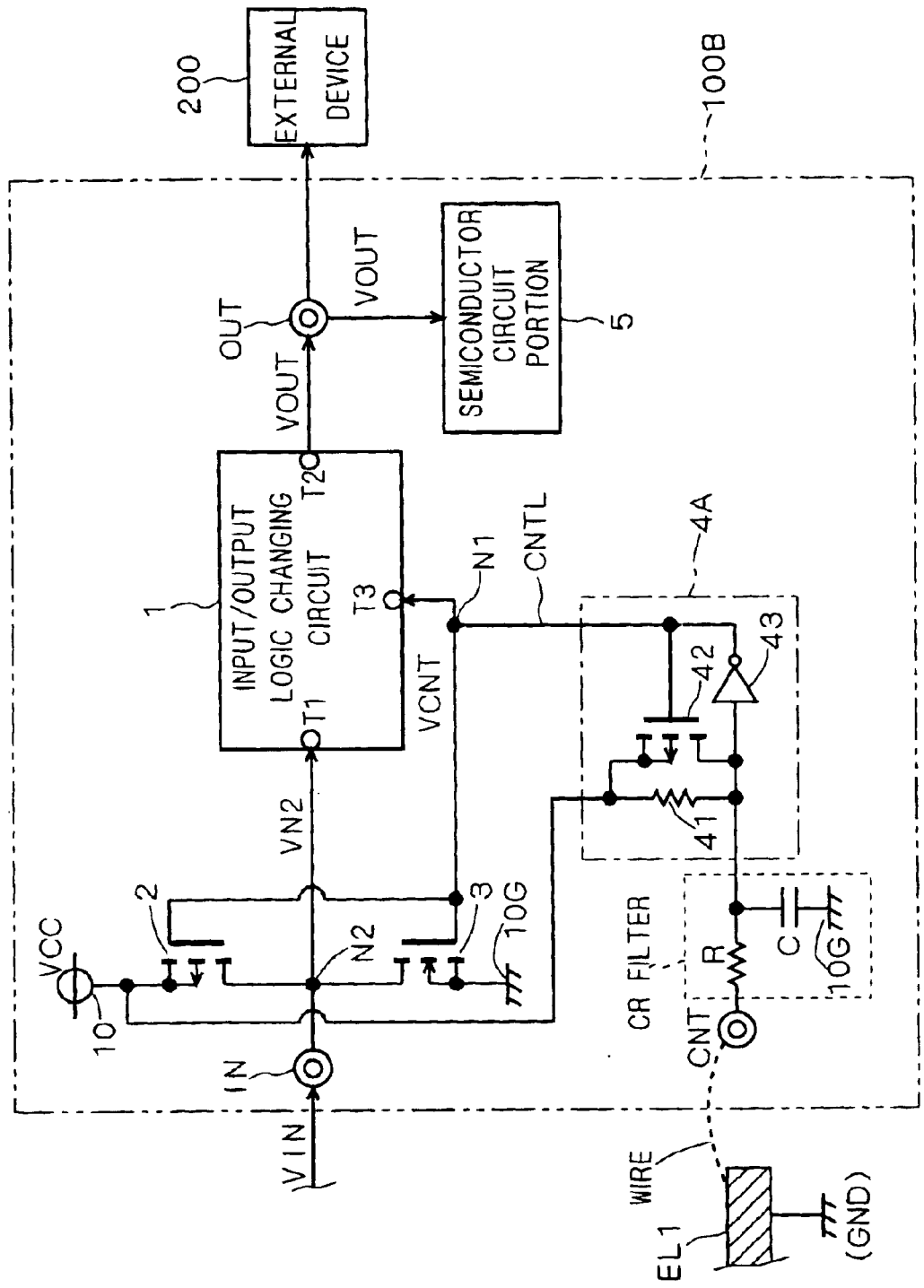
FIG. 6 is a block diagram illustrating a configuration of a semiconductor integrated circuit device according to a second modification of the present invention.

FIG. 6 is a block diagram illustrating a configuration of a semiconductor integrated circuit device 100B according to a second modification of the first preferred embodiment. One of features of the second modification resides in that a logic state holding circuit 4A is provided in place of the buffer 4 in the configuration of FIG. 1. The configuration according to the second modification corresponds to a configuration which is obtained simply by applying a logic state holding circuit according to a second preferred modification which will be later detailed, to the semiconductor integrated circuit device 100 according to the first preferred embodiment. Thus, with respect to the configuration, operations and advantages of the device 100B illustrated in FIG. 6, a description later provided in the second preferred embodiment can be referred to. Detailed description about the device 100B illustrated in FIG. 6 will be omitted in this section.

Figure 7:
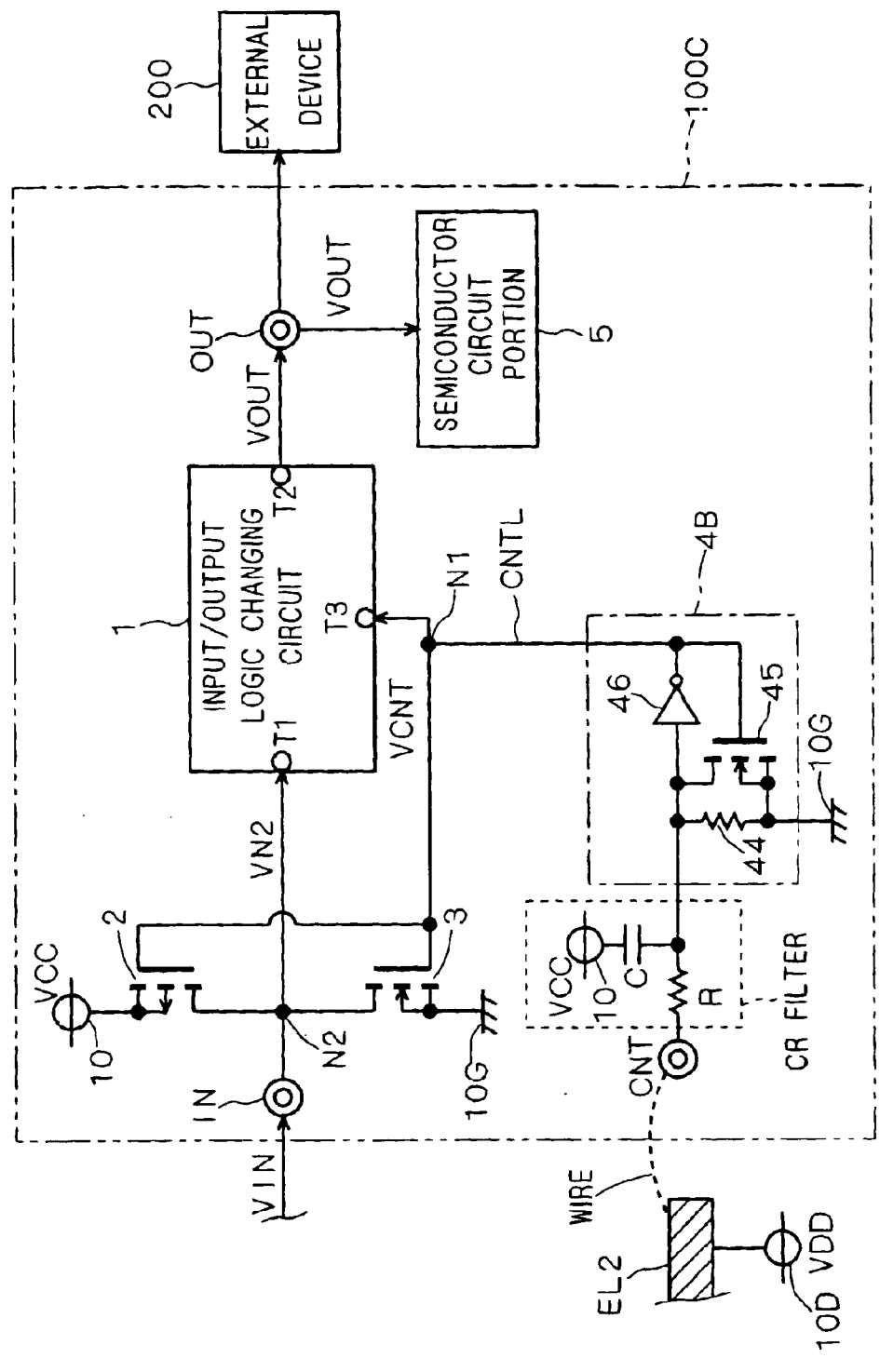
FIG. 7 is a block diagram illustrating a configuration of a semiconductor integrated circuit device according to a variation of the second modification of the present invention.

Likewise, FIG. 7 is a block diagram illustrating a configuration of a semiconductor integrated circuit device 100C according to a variation of the second modification. Similarly to the device 100B, one of features of the device 100C illustrated in FIG. 7 resides in that a logic state holding circuit 4B exhibiting the same effects as those exhibited by the logic state holding circuit 4A is provided in place of the buffer 4 in the configuration of FIG. 1. Thus, with respect to the configuration, operations and advantages of the device 100C illustrated in FIG. 7, a description later provided in a variation of the second preferred embodiment can be referred to. Detailed description about the device 100C illustrated in FIG. 7 will be omitted in this section.

Second Preferred Embodiment

Figure 8:
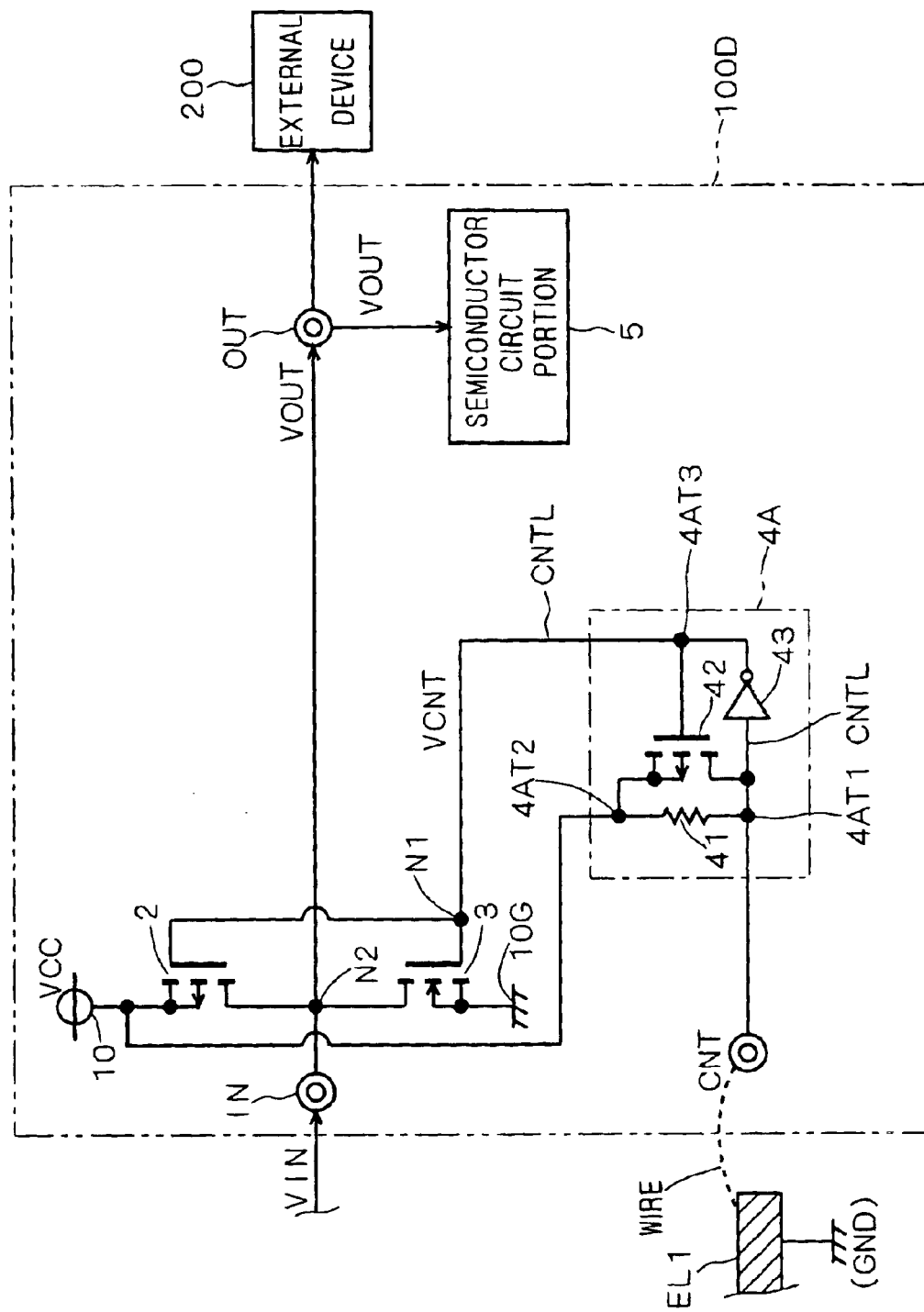
FIG. 8 is a block diagram illustrating a configuration of a semiconductor integrated circuit device according to a second preferred embodiment of the present invention.

FIG. 8 is a block diagram illustrating a configuration of a semiconductor integrated circuit device 100D according to a second preferred embodiment of the present invention. In FIG. 8, circuit elements corresponding to those in FIG. 1 are denoted by the same reference numerals. Accordingly, an appropriate portion in the description of the first preferred embodiment should be referred to, for details of those circuit elements.

A feature of the device 100D illustrated in FIG. 8 resides in that a logic state holding circuit 4A is provided on the control signal line CNTL, in particular, between the control terminal CNT and the node N1 to which the gate electrodes of the MOS transistors 2 and 3 are connected in common.

The logic state holding circuit 4A includes a first terminal 4AT1 connected to the control terminal CNT, a second terminal 4AT2 connected to an output terminal of the power supply 10, and a third terminal 4AT3. The logic state holding circuit 4A is configured to generate the control signal VCNT having a specific logic level (either "H" level or "L" level), in accordance with a logic level at which the control terminal CNT is held, that is, an electric potential state of the control terminal CNT. In other words, the logic state holding circuit 4A determines the specific logic level of the control signal VCNT depending on whether the control terminal CNT is in an open state or not. After determination of the specific logic level of the control signal VCNT, the logic state holding circuit 4A outputs the control signal VCNT from the third terminal 4AT3. The specific logic level of the control signal VCNT corresponds to either a high logic level "H" of the power supply 10 or a low logic level "L" of the ground terminal 10G.

The control signal line CNTL includes (1) one end or one electric node connected to the third terminal 4AT3 and (2) the other end or the other electric node N1 connected to the first gate electrode of the first MOS transistor 2 and the second gate electrode of the second MOS transistor 3. The control signal line CNTL transmits the control signal VCNT thereon to the other end N1.

Specifically, the logic state holding circuit 4A has (1) a resistor 41 including one end connected to the power supply 10 and the other end connected to the control terminal CNT. The one end of the resistor 41 corresponds to the second terminal 4AT2, and the other end of the resistor 41 corresponds to the first terminal 4AT1. Further, the logic state holding circuit 4A has (2) a PMOS transistor 42 connected in parallel to the resistor 41 (a drain electrode and a source electrode of the PMOS transistor 42 are connected to the control signal line CNTL and the power supply 10, respectively). Moreover, the logic state holding circuit 4A has (3) an inverter circuit 43 which is provided on the control signal line CNTL and includes an input end connected to the control terminal CNT and an output end connected to both the one end of the control signal line CNTL connected to the third terminal 4AT3 and a gate electrode of the PMOS transistor 42. Accordingly, the output end of the inverter circuit 43 serves as the third terminal 4AT3.

In accordance with the second preferred embodiment, no control signal is externally applied to the control terminal CNT. Nevertheless, the logic state holding circuit 4A is capable of generating and maintaining the control signal VCNT having a specific logic level (either "H" level or "L" level) through its operations, with stability. Below, description will be made about this aspect of the second preferred embodiment for each of the two cases of the cases A and B in the same manner as in the first preferred embodiment.

<Case A>

In the case A, the control terminal CNT is not connected to a lead wire EL1 provided externally to the semiconductor integrated circuit device 100D, and is placed in an open or floating state.

The PMOS transistor 42 is placed in an on-state, so that the logic level of a potential on the control terminal CNT or the control signal line CNTL serving as a main line within the logic state holding circuit 4A is constantly maintained at "H" level. Accordingly, the logic state holding circuit 4A internally generates an output signal constantly having "L" level as the specific logic level, as the control signal VCNT, with stability during a period in which the control terminal CNT is placed in an open state. As a result, the control signal line CNTL continues applying a voltage with the specific logic level, i.e., "L" level, to each of the respective gate electrodes of the MOS transistors 2 and 3 with stability, even if no control signal is externally applied to the semiconductor integrated circuit device 100D via the control terminal CNT. Hence, when the input terminal IN is placed in an open state, pull-up is performed.

<Case B>

In the case B, the control terminal CNT is connected to the lead wire EL1 provided externally or internally to the semiconductor integrated circuit device 100D via a wire by wire-bonding processes as indicated by a broken line in FIG. 8, and the lead wire EL1 is grounded, in contrast to the case A described above.

The PMOS transistor 42 is constantly placed in an off-state, so that the logic level of a potential on the control terminal CNT or the control signal line CNTL within the logic state holding circuit 4A is constantly maintained at "L" level. Accordingly, the logic state holding circuit 4A generates an output signal constantly having "H" level as the specific logic level, as the control signal VCNT, with stability during a period in which the control terminal CNT is connected to the grounded lead wire EL1. As a result, the control signal line CNTL continues applying a voltage having the specific logic level, i.e., "H" level, to each of the respective gate electrodes of the MOS transistors 2 and 3 with stability. Hence, when the input terminal IN is placed in an open state, pull-down is performed.

As described above, in accordance with the second preferred embodiment, the logic state holding circuit 4A is included, which eliminates a need of additionally providing an external power supply for generating a control signal which is required in the first preferred embodiment in order to determine the logic level of the control signal VCNT transmitted through the control signal line CNTL In accordance with the second preferred embodiment, it is possible to determine the logic level of the control signal VCNT on the control signal line CNTL internally or simply by fixing the control terminal CNT to a lead wire, without using an additional power source, thereby to select either pull-up or pull-down.

Figure 9:
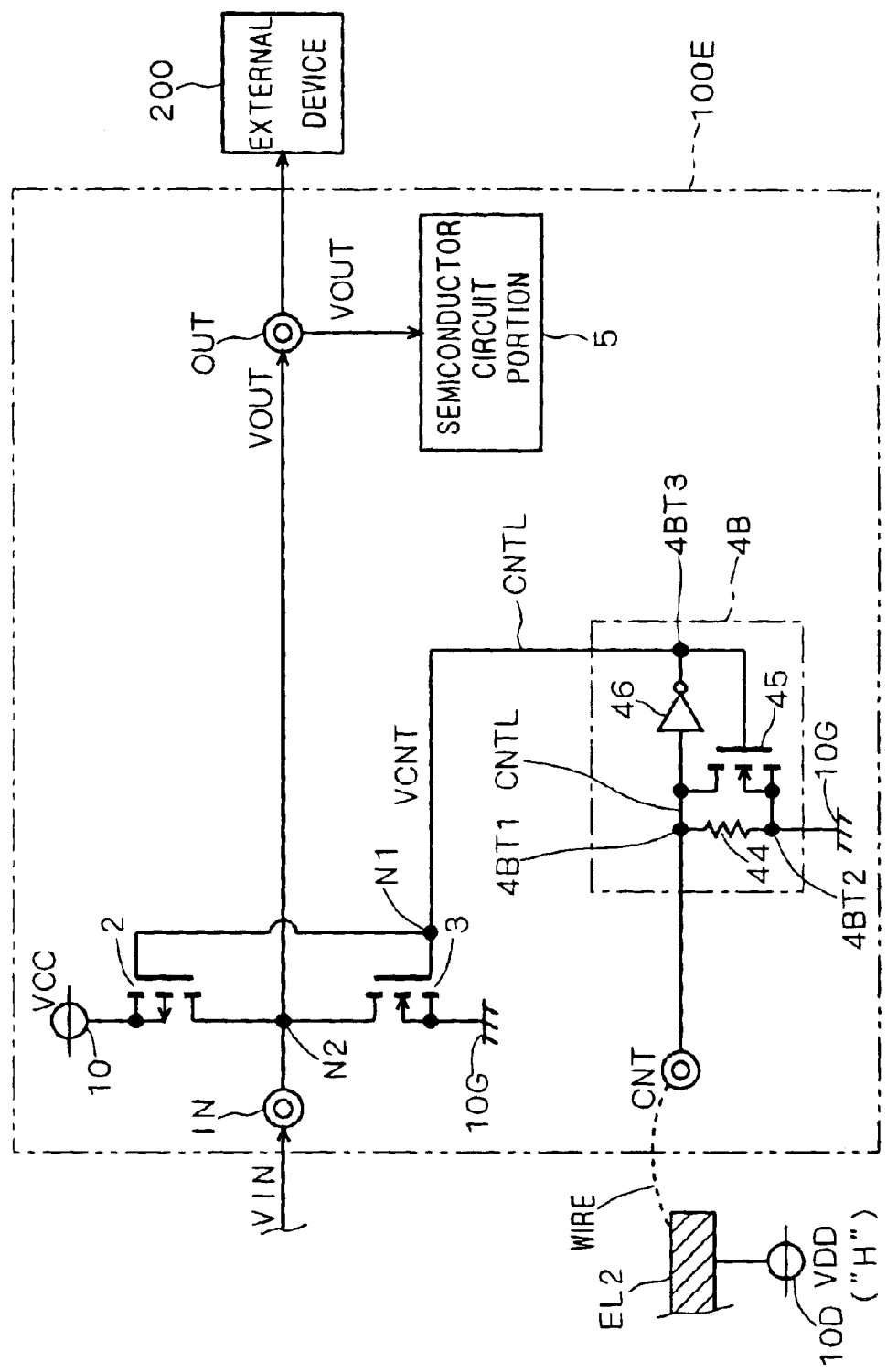
FIG. 9 is a block diagram illustrating a configuration of a semiconductor integrated circuit device according to a variation of the second preferred embodiment.

FIG. 9 is a block diagram illustrating a configuration of a semiconductor integrated circuit device 100E according to a variation of the second preferred embodiment. The device 100E in FIG. 9 is formed by providing a logic state holding circuit 4B in place of the logic state holding circuit 4A in FIG. 8.

The logic state holding circuit 4B comprises a resistor 44 including one end connected to the control terminal CNT and the other end connected to the ground terminal 10G. The one end of the resistor 44 corresponds to a first terminal 4BT1 of the logic state holding circuit 4B, and the other end of the resistor 44 corresponds to a second terminal 4BT2 of the logic state holding circuit 4B. Further, the logic state holding circuit 4B comprises an NMOS transistor 45 connected in parallel to the resistor 44 (a drain electrode and a source electrode of the NMOS transistor 45 are connected to the terminals 4BT1 and 4BT2, respectively). Moreover, the logic state holding circuit 4B comprises an inverter circuit 46 including an input end connected to the control terminal CNT and an output end connected to both the one end of the control signal line CNTL connected to a third terminal 4BT3 of the circuit 4B and a gate electrode of the NMOS transistor 45. Accordingly, when the control terminal CNT is placed in an open state, the logic state holding circuit 4B continues outputting the control signal VCNT having "H" level as the specific logic level, to the control signal line CNTL with stability. On the other hand, when the control terminal CNT is connected to a lead wire EL2 which is provided externally or internally to the semiconductor integrated circuit device 100E via a wire (a potential VDD, a logic level of which is "H", is applied from another power supply 10D to the lead wire EL2), the logic state holding circuit 4B continues outputting the control signal VCNT having "L" level as the specific logic level to the control signal line CNTL with stability, contrary to the above-noted situation where the control terminal CNT is placed in an open state. Hence, the semiconductor integrated circuit device 100E according to this variation also produces the same effects as those produced by the semiconductor integrated circuit device 100D in FIG. 8.

Third Modification

Features of a third modification reside in that a CR filter for eliminating an external noise superposed on the control terminal CNT is additionally provided between an input end of the logic state holding circuit 4A or 4B and the control terminal CNT in the semiconductor integrated circuit device according to the second preferred embodiment illustrated in FIG. 8 or 9. There is no other difference between the second and third preferred embodiments.

Figure 10:
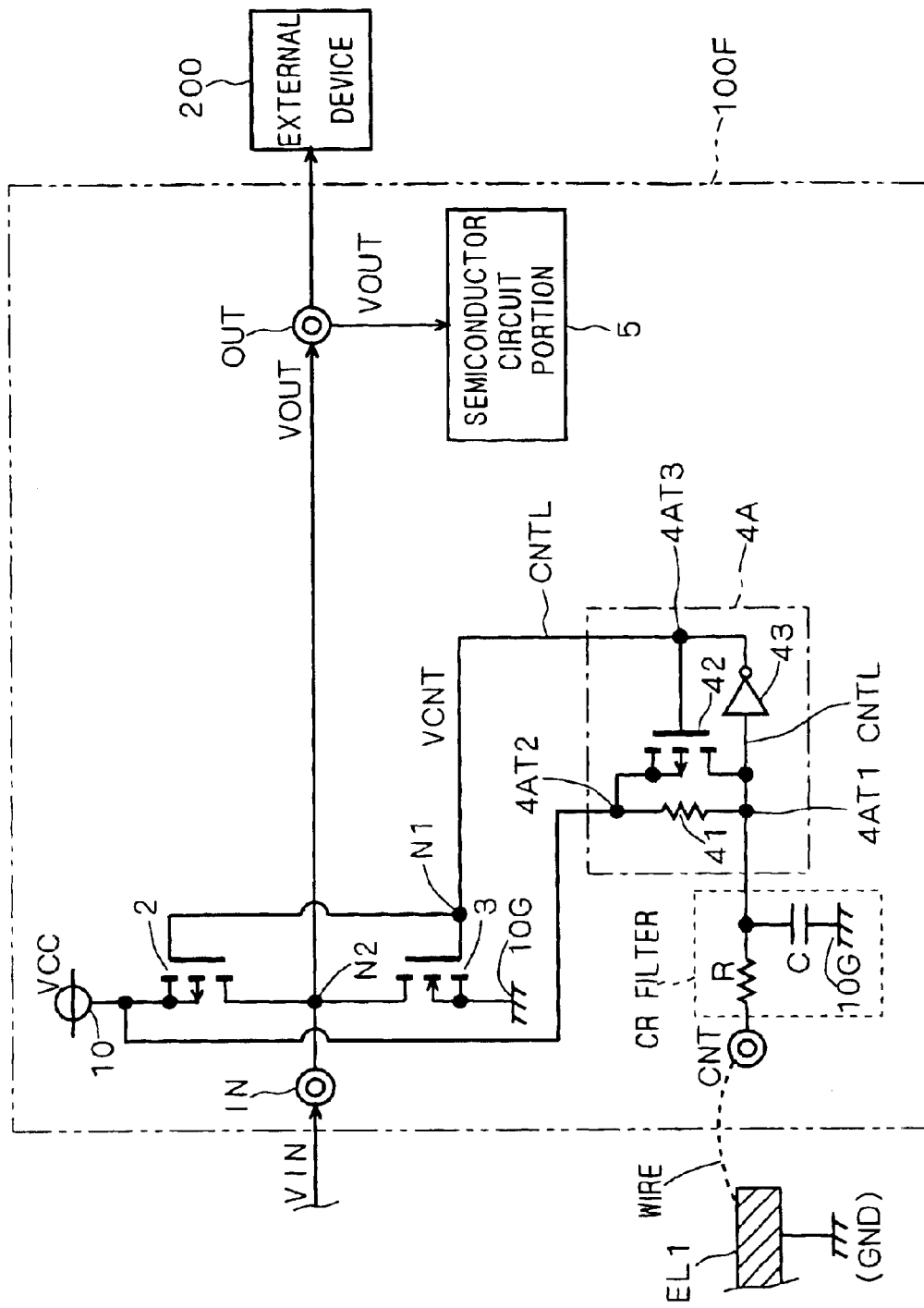
FIG. 10 is a block diagram illustrating a configuration of a semiconductor integrated circuit device according to a third modification of the present invention.
Figure 11:
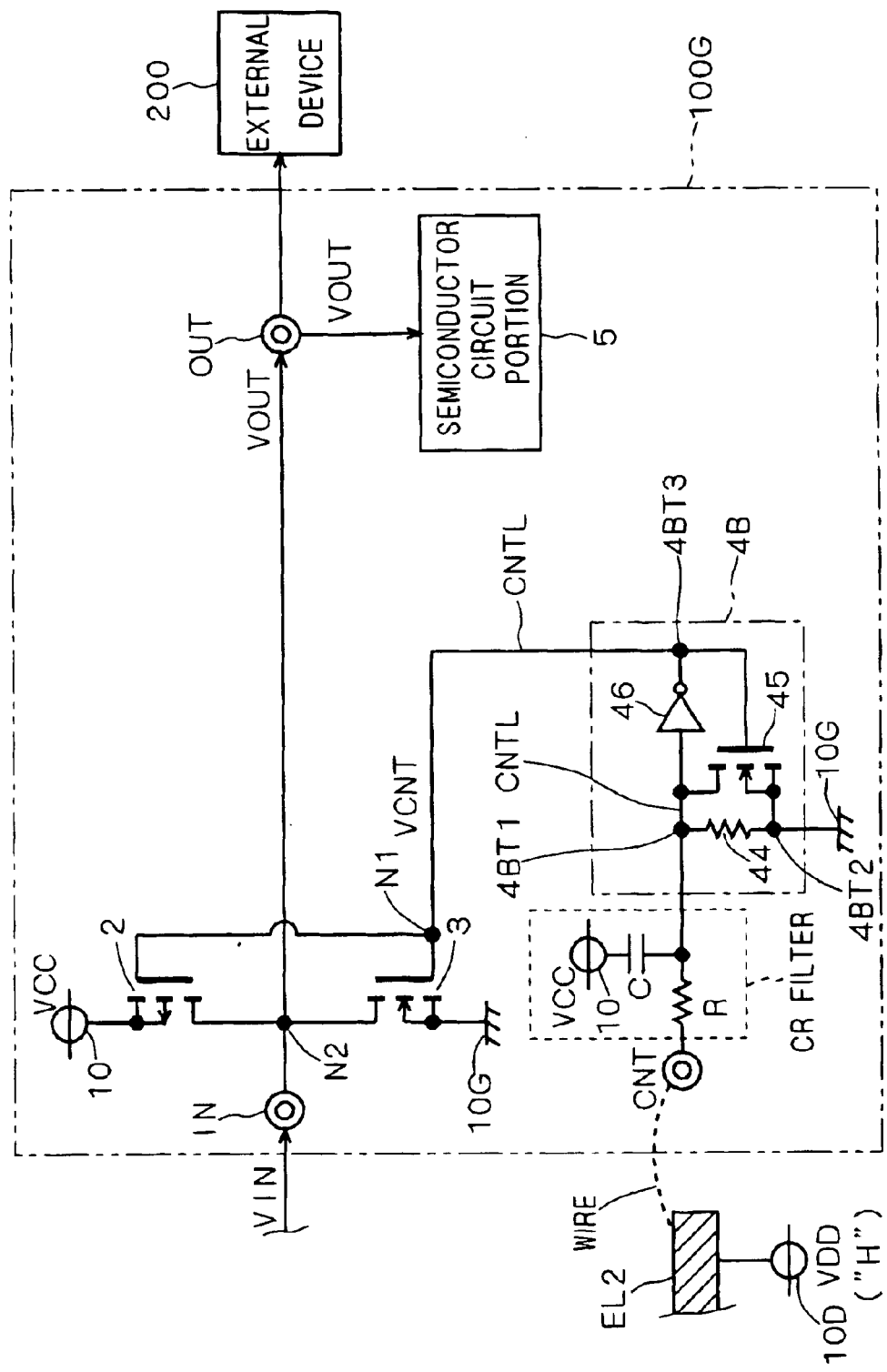
FIG. 11 is a block diagram illustrating a configuration of a semiconductor integrated circuit device according to a variation of the third modification of the present invention.
Figure 12:
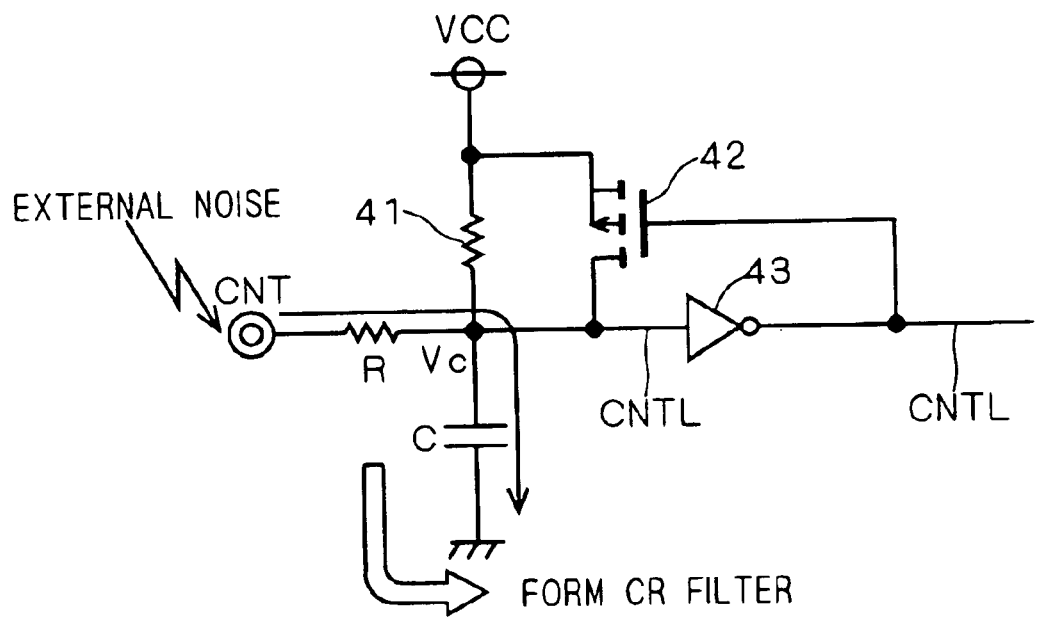
FIG. 12 is a schematic view for illustrating operations of a noise eliminating filter which constitutes features of the third modification of the present invention.

FIG. 10 is a block diagram illustrating a configuration of a semiconductor integrated circuit device 100F according to the third modification. FIG. 11 is a block diagram illustrating a configuration of a semiconductor integrated circuit device 100G according to a variation of the third modification. FIG. 12 is a schematic view for illustrating operations of a noise eliminating filter which constitutes the features of the third modification.

A capacitor C and a resistor R are connected in such a manner as illustrated in FIG. 10 or 11, thereby to form the CR filter adjacent to the control terminal CNT. With this configuration, an amount Δ Vc of a noise on the control terminal CNT gets closer and closer to "0" as a value of the capacitor C increases, because opposite voltages of the capacitor C are unlikely to change at an initial stage. This makes it possible to reduce an influence exerted by an external noise superposed on the control terminal CNT. Accordingly, provision of the foregoing CR filter adjacent to the control terminal CNT produces an advantage of further stabilizing the control signal VCNT to be supplied to, and kept by, the control signal line CNTL The configuration including the CR filter according to the third modification is effective particularly in the case A where the control terminal CNT is kept placed in an open state.

Remarks

Below, supplemental explanation about the term "MOS transistor" used in this specification will be made. The term "MOS transistor" used in this specification means a transistor having a MOS structure such as a MOSFET and an IGBT device. Also, an element referred to as a "MOS transistor" in this specification serves as a switching element, functionally. Thus, as the term "MOS transistor" in this specification is recognized as a concept involving functional and technological reputation, the term "MOS transistor" should be broadly interpreted as a concept encompassing a bipolar transistor (a PNP transistor or the like) serving as a switching element, for example.

The power supply potential (voltage) VCC can be generated by an external power supply (not shown) to be entered in a power supply line or a power supply terminal of the semiconductor integrated circuit device 100, 100A, 100B, 100C, 100D, 100E, 100F or 100G.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device, comprising:
   a power supply line transmitting a power supply voltage;
   an input terminal;
   an output terminal;
   a control terminal;
   a ground terminal;
   a first MOS transistor including a first main electrode connected to said power supply line transmitting a power supply voltage, a second main electrode connected to said input terminal, and a first gate electrode, said first MOS transistor flowing a pull-up current from said first main electrode to said second main electrode in a first on-state where said first MOS transistor is in an on-state when no input signal is input to said input terminal;
   a second MOS transistor including a third main electrode connected to said input terminal, a fourth main electrode connected to said ground terminal, and a second gate electrode, said second MOS transistor flowing a pull-down current from said third main electrode to said fourth main electrode in a second on-state where said second MOS transistor is in an on-state when no input signal is input to said input terminal;

an input/output logic changing circuit including a first terminal connected to said input terminal, a second terminal connected to said output terminal, and a third terminal; and a control signal line including one end connected to said control terminal and the other end connected to said first gate electrode, said second gate electrode and said third terminal, said control signal line transmitting a control signal thereon to said other end, wherein when said control signal has a first level, said first MOS transistor and said second MOS transistor are placed in said first on-state and a second off-state where said second MOS transistor is in an off-state, respectively, when said control signal has a second level, said first MOS transistor and said second MOS transistor are placed in a first off-state where said first MOS transistor is in an off-state and said second on-state, respectively, and when an input signal is input to said input terminal, said input/output logic changing circuit determines a logic level of an output signal based on said input signal and said control signal to thereby output said output signal to said output terminal.

2. The semiconductor integrated circuit device according to claim 1, wherein said input/output logic changing circuit comprises:

a comparator including a positive terminal connected to said input terminal and a negative terminal to which a threshold voltage is applied, said threshold voltage being higher than a ground potential at which said ground terminal is held and lower than a voltage of said power supply; and an exclusive-or circuit including a first input terminal connected to an output terminal of said comparator and a second input terminal connected to said other end of said control signal line.

3. The semiconductor integrated circuit device according to claim 1, further comprising:

a delay circuit including a fourth terminal connected to said second terminal and a fifth terminal connected to said output terminal of said semiconductor integrated circuit device, said delay circuit delaying said output signal to output a delayed output signal to said output terminal of said semiconductor integrated circuit device.

4. The semiconductor integrated circuit device according to claim 1, wherein said control signal line further comprises a logic state holding circuit, and said logic state holding circuit comprises:

a resistor including one end connected to said power supply line transmitting a power supply voltage and the other end connected to said control terminal;

a PMOS transistor connected in parallel to said resistor; and an inverter circuit including an input end connected to said control terminal and an output end connected to said first gate electrode, said second gate electrode, said third terminal, and a gate electrode of said PMOS transistor.

5. The semiconductor integrated circuit device according to claim 4, wherein said control terminal is placed in an open state.

6. The semiconductor integrated circuit device according to claim 4, wherein said control terminal is grounded.

7. The semiconductor integrated circuit device according to claim 1, wherein said control signal line further comprises a logic state holding circuit, and said logic state holding circuit comprises:

a resistor including one end connected to said control terminal and the other end connected to said ground terminal;

an NMOS transistor connected in parallel to said resistor; and an inverter circuit including an input end connected to said control terminal and an output end connected to said first gate electrode, said second gate electrode, said third terminal, and a gate electrode of said NMOS transistor.

8. The semiconductor integrated circuit device according to claim 7, wherein said control terminal is placed in an open state.

9. The semiconductor integrated circuit device according to claim 4, wherein an electric potential of an "H" logic level is applied to said control terminal.

10. A semiconductor integrated circuit device, comprising:

a power supply line transmitting a power supply voltage;

an input terminal;

an output terminal;

a control terminal;

a ground terminal;

a first MOS transistor including a first main electrode connected to said power supply line transmitting a power supply voltage, a second main electrode connected to said input terminal, and a first gate electrode, said first MOS transistor flowing a pull-up current from said first main electrode to said second main electrode in a first on-state where said first MOS transistor is in an on-state when no input signal is input to said input terminal;

a second MOS transistor including a third main electrode connected to said input terminal, a fourth main electrode connected to said ground terminal, and a second gate electrode, said second MOS transistor flowing a pull-down current from said third main electrode to said fourth main electrode in a second on-state where said second MOS transistor is in an on-state when no input signal is input to said input terminal;

a logic state holding circuit including a first terminal connected to said control terminal, a second terminal connected to any one out of said power supply line and said ground terminal, and a third terminal, said logic state holding circuit being configured to generate a control signal having a specific logic level based on a logic level at which said control terminal is held, to thereby output said control signal from said third terminal, said specific logic level corresponding to any one out of a high logic level of said power supply line and a low logic level of said ground terminal; and a control signal line including one end connected to said third terminal and the other end connected to said first gate electrode and said second gate electrode, said control signal line transmitting said control signal thereon to said other end, wherein when said specific logic level of said control signal is a first level, said first MOS transistor and said second MOS transistor are placed in said first on-state and a second off-state where said second MOS transistor is in an off-state, respectively, and when said specific logic level of said control signal is a second level, said first MOS transistor and said second MOS transistor are placed in a first off-state where said first MOS transistor is in an off-state and said second on-state, respectively.

11. The semiconductor integrated circuit device according to claim 10, wherein said logic state holding circuit determines said specific logic level of said control signal depending on whether said control terminal is in an open state or not.

12. The semiconductor integrated circuit device according to claim 10, wherein said logic state holding circuit comprises:

a resistor including one end connected to said power supply line and the other end connected to said control terminal, said one end of said resistor corresponding to said second terminal, said other end of said resistor corresponding to said first terminal;

a PMOS transistor connected in parallel to said resistor; and an inverter circuit including an input end connected to said control terminal and an output end connected to said one end of said control signal line and a gate electrode of said PMOS transistor, said output end serving as said third terminal.

13. The semiconductor integrated circuit device according to claim 12, wherein said control terminal is placed in an open state.

14. The semiconductor integrated circuit device according to claim 12, wherein said control terminal is grounded.

15. The semiconductor integrated circuit device according to claim 10, wherein said logic state holding circuit comprises:

a resistor including one end connected to said control terminal and the other end connected to said ground terminal, said one end of said resistor corresponding to said first terminal, said other end of said resistor corresponding to said second terminal;

an NMOS transistor connected in parallel to said resistor; and an inverter circuit including an input end connected to said control terminal and an output end connected to said one end of said control signal line and a gate electrode of said NMOS transistor, said output end serving as said third terminal.

16. The semiconductor integrated circuit device according to claim 15, wherein said control terminal is placed in an open state.

17. The semiconductor integrated circuit device according to claim 15, wherein an electric potential of an "H" logic level is applied to said control terminal.

18. The semiconductor integrated circuit device according to claim 10, further comprising:

a resistor including one end connected to said control terminal and the other end connected to said first terminal of said logic state holding circuit; and a capacitor including one end connected to said first terminal of said logic state holding circuit and the other end connected to any one out of said power supply line and said ground terminal.

19. A semiconductor integrated circuit device, comprising:

a power supply line;

an input terminal;

an output terminal;

a control terminal;

a ground terminal;

an input/output logic changing circuit including a first terminal connected to said input terminal, a second terminal connected to said output terminal, and a third terminal;

a logic state holding circuit including a fourth terminal connected to said control terminal, a fifth terminal connected to any one out of said power supply line and said ground terminal, and a sixth terminal, said logic state holding circuit being configured to generate a control signal having a specific logic level based on a logic level at which said control terminal is held, to thereby output said control signal from said sixth terminal, said specific logic level of said control signal corresponding to any one out of a high logic level of said power supply line and a low logic level of said ground terminal; and a control signal line including one end connected to said sixth terminal and the other end connected to said third terminal, said control signal line transmitting said control signal thereon to said other end, wherein when an input signal is input to said input terminal, said input/output logic changing circuit determines a logic level of an output signal based on said input signal and said control signal to thereby output said output signal to said output terminal; and said logic state holding circuit is configured to determine said specific logic level of said control signal even if said control terminal is in an open state.

20. The semiconductor integrated circuit device according to claim 19, further comprising:

a resistor including one end connected to said control terminal and the other end connected to said fourth terminal of said logic state holding circuit; and a capacitor including one end connected to said fourth terminal of said logic state holding circuit and the other end connected to any one out of said power supply line and said ground terminal.

* * * * *